United States Patent
Morikazu et al.

(10) Patent No.: US 10,727,127 B2
(45) Date of Patent: Jul. 28, 2020

(54) METHOD OF PROCESSING A SUBSTRATE

(71) Applicant: DISCO Corporation, Tokyo (JP)

(72) Inventors: Hiroshi Morikazu, Tokyo (JP); Karl Heinz Priewasser, Munich (DE); Nao Hattori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/872,615

(22) Filed: Jan. 16, 2018

(65) Prior Publication Data

US 2018/0204771 A1 Jul. 19, 2018

(30) Foreign Application Priority Data

Jan. 17, 2017 (DE) .......................... 10 2017 200 631

(51) Int. Cl.
| | |
|---|---|
| *H01L 21/78* | (2006.01) |
| *B23K 26/0622* | (2014.01) |
| *B23K 26/38* | (2014.01) |
| *B28D 5/02* | (2006.01) |
| *B23K 26/00* | (2014.01) |

(Continued)

(52) U.S. Cl.
CPC .......... *H01L 21/78* (2013.01); *B23K 26/0006* (2013.01); *B23K 26/0622* (2015.10); *B23K 26/0876* (2013.01); *B23K 26/38* (2013.01); *B23K 26/53* (2015.10); *B28D 5/022* (2013.01); *B23K 2101/40* (2018.08); *B23K 2103/52* (2018.08); *B23K 2103/54* (2018.08);

(Continued)

(58) Field of Classification Search
None
See application file for complete search history.

(56) References Cited

U.S. PATENT DOCUMENTS

| 7,964,475 B2 | 6/2011 | Haraguchi et al. |
| 8,518,800 B2 | 8/2013 | Fujii et al. |

(Continued)

FOREIGN PATENT DOCUMENTS

| JP | 2003338468 A | 11/2003 |
| JP | 2004351477 A | 12/2004 |

(Continued)

OTHER PUBLICATIONS

Chen et al., Localized Laser Transmission Bonding for Microsystem Fabrication and Packaging, 2004, pp. 1-8.*

(Continued)

*Primary Examiner* — Angel Roman
(74) *Attorney, Agent, or Firm* — Greer Burns & Crain Ltd.

(57) ABSTRACT

A method of processing a substrate, having a first surface with at least one division line formed thereon and a second surface opposite the first surface, includes applying a pulsed laser beam to the substrate from the side of the first surface, at least in a plurality of positions along the at least one division line, so as to form a plurality of modified regions in the substrate, each modified region extending at least from the first surface towards the second surface. Each modified region is formed by melting substrate material by means of the pulsed laser beam and allowing the molten substrate material to resolidify. The method further comprises removing substrate material along the at least one division line where the plurality of modified regions has been formed.

17 Claims, 10 Drawing Sheets

(51) Int. Cl.
*B23K 26/08* (2014.01)
*B23K 26/53* (2014.01)
*B23K 101/40* (2006.01)
*B23K 103/00* (2006.01)
*H01L 21/304* (2006.01)
*H01L 33/00* (2010.01)

(52) U.S. Cl.
CPC ........ *B23K 2103/56* (2018.08); *H01L 21/304* (2013.01); *H01L 33/0095* (2013.01)

(56) References Cited

U.S. PATENT DOCUMENTS

| | | | |
|---|---|---|---|
| 8,673,743 B2 | 3/2014 | Arai | |
| 8,809,166 B2 | 8/2014 | Buenning et al. | |
| 8,871,540 B2 | 10/2014 | Sato | |
| 9,138,913 B2 | 9/2015 | Arai et al. | |
| 10,068,801 B2 | 9/2018 | Fujii et al. | |
| 2002/0037631 A1 | 3/2002 | Mimata | |
| 2005/0035100 A1 | 2/2005 | Genda | |
| 2005/0130390 A1* | 6/2005 | Andrews | B28D 1/221 |
| | | | 438/458 |
| 2005/0272223 A1 | 12/2005 | Fujii et al. | |
| 2007/0155131 A1 | 7/2007 | Contes | |
| 2008/0135975 A1 | 6/2008 | Haraguchi et al. | |
| 2009/0215245 A1 | 8/2009 | Nakamura | |
| 2010/0136766 A1* | 6/2010 | Sakamoto | H01L 21/67132 |
| | | | 438/463 |
| 2013/0059428 A1* | 3/2013 | Arai | H01L 21/78 |
| | | | 438/462 |
| 2014/0017880 A1 | 1/2014 | Lei et al. | |
| 2014/0179083 A1 | 6/2014 | Buenning et al. | |
| 2014/0213043 A1 | 7/2014 | Van der Stam | |
| 2016/0067822 A1 | 3/2016 | Arai et al. | |
| 2017/0076983 A1* | 3/2017 | Morikazu | H01L 21/304 |
| 2017/0221763 A1* | 8/2017 | Morikazu | H01L 21/3065 |
| 2018/0161921 A1* | 6/2018 | Morikazu | H01L 21/78 |

FOREIGN PATENT DOCUMENTS

| | | |
|---|---|---|
| JP | 2005184032 A | 7/2005 |
| JP | 2008147412 A | 6/2008 |
| JP | 2011210915 A | 10/2011 |
| JP | 2012119669 A | 6/2012 |
| JP | 2012146874 A | 8/2012 |
| JP | 2013055120 A | 3/2013 |
| JP | 2016054205 A | 4/2016 |
| JP | 2016163016 A | 9/2016 |
| JP | 2017005158 A | 1/2017 |
| JP | 2017005160 A | 1/2017 |
| KR | 1020170031070 A | 3/2017 |

OTHER PUBLICATIONS

Official action issued by the German Patent Office in application DE 10 2017 200 631.5, dated Sep. 19, 2017.
Examination report issued in corresponding German application DE 10 2016 224 978, dated Jul. 19, 2017.

* cited by examiner

6(a)

6(b)

6(c)

10(a)

10(b)

METHOD OF PROCESSING A SUBSTRATE

TECHNICAL FIELD

The present invention relates to a method of processing a substrate, having a first surface with at least one division line formed thereon and a second surface opposite the first surface.

TECHNICAL BACKGROUND

In an optical device fabrication process, an optical device layer, e.g., composed of an n-type nitride semiconductor layer and a p-type nitride semiconductor layer, is formed on the front side of a single crystal substrate, such as a sapphire substrate, a silicon carbide (SiC) substrate or a gallium nitride (GaN) substrate. The optical device layer is partitioned by crossing division lines (also referred to as "streets") to define separate regions where optical devices, such as light emitting diodes (LEDs) and laser diodes, are respectively formed. By providing the optical device layer on the front side of the single crystal substrate, an optical device wafer is formed. The optical device wafer is separated, e.g., cut, along the division lines to divide the separate regions where the optical devices are formed, thereby obtaining the individual optical devices as chips or dies.

As a method of dividing a wafer, such as an optical device wafer, along the division lines, there has been proposed a laser processing method of applying a pulsed laser beam, having a wavelength allowing transmission of the beam through the wafer, to the wafer along the division lines in a condition where a focal point of the pulsed laser beam is located inside the wafer in a subject area to be divided. In this way, a modified layer having a reduced strength is continuously formed inside the wafer along each division line. Subsequently, an external force is applied to the wafer along each division line by using a breaking tool, thereby dividing the wafer into the individual optical devices. Such a method is disclosed in JP-A-3408805.

As another method of dividing a wafer, such as an optical device wafer, along the division lines, it has been proposed to apply a pulsed laser beam to the wafer in a condition where a focal point of the beam is located at a distance from the front side of the wafer in the direction towards the back side thereof, in order to create a plurality of hole regions in the single crystal substrate. Each hole region is composed of an amorphous region and a space in the amorphous region open to the front side of the wafer. Subsequently, an external force is applied to the wafer along each division line by using a breaking tool, thus dividing the wafer into the individual optical devices.

However, when applying the external force to the wafer using the breaking tool in the above-mentioned dividing methods, a shift of the resultant chips or dies relative to each other may occur. Such a die shift not only renders the process of picking up the chips or dies more complicated but also creates the risk of damage to the chips or dies, e.g., if their side surfaces touch each other due to the shift.

Further, the individual chips or dies may not be properly separated from each other by the application of the external force using the breaking tool. For one thing, two or more of the chips or dies may still be, at least partially, connected to each other after the breaking process, so that it is necessary to inspect the wafer after die separation. For another thing, the outer shape of the resultant chips or dies, i.e., the shape of their side surfaces, after separation thereof cannot be controlled with a high degree of accuracy.

The problems referred to above are particularly pronounced for transparent crystal materials which are difficult to process, such as silicon (Si), gallium arsenide (GaAs), gallium nitride (GaN), gallium phosphide (GaP), indium arsenide (InAs), indium phosphide (InP), silicon carbide (SiC), silicon nitride (SiN), lithium tantalate (LT), lithium niobate (LN), sapphire ($Al_2O_3$), aluminium nitride (AlN), silicon oxide ($SiO_2$) or the like.

Hence, there remains a need for a method of processing a substrate which allows for the substrate to be processed in an accurate, reliable and efficient manner.

SUMMARY OF THE INVENTION

Accordingly, it is an object of the present invention to provide a method of processing a substrate which allows for the substrate to be processed in an accurate, reliable and efficient manner. This goal is achieved by a substrate processing method with the technical features of claim 1. Preferred embodiments of the invention follow from the dependent claims.

The invention provides a method of processing a substrate, having a first surface, e.g., a front surface, with at least one division line formed thereon and a second surface, e.g., a back surface, opposite the first surface. The method comprises applying a pulsed laser beam to the substrate from the side of the first surface, at least in a plurality of positions along the at least one division line, so as to form a plurality of modified regions in the substrate, each modified region extending at least from the first surface towards the second surface. Each modified region is formed by melting substrate material by means of the pulsed laser beam and allowing the molten substrate material to resolidify. The method further comprises removing substrate material along the at least one division line where the plurality of modified regions has been formed.

Each modified region extends all the way to the first surface, i.e., so as to reach the first surface. The modified regions are thus present in the first surface.

Some or all of the modified regions may extend all the way to the second surface, i.e., so as to reach the second surface. The modified regions may thus be present in the second surface. Some or all of the modified regions may not extend all the way to the second surface.

The pulsed laser beam is applied to the substrate at least in a plurality of positions along the at least one division line, i.e., along the extension direction of the at least one division line.

In the method of the invention, the pulsed laser beam is applied to the substrate at least in a plurality of positions along the at least one division line. Hence, the modified regions are formed in the plurality of positions along the at least one division line.

According to the processing method of the invention, the pulsed laser beam is applied to the substrate from the side of the first surface at least in a plurality of positions along the at least one division line, so as to form a plurality of modified regions along the at least one division line. By forming these modified regions, the strength of the substrate in the areas thereof where the modified regions are formed is reduced. Hence, the removal of substrate material along the at least one division line where the plurality of modified regions has been formed is greatly facilitated.

Further, since substrate material is removed along the at least one division line where the plurality of modified regions has been formed, no application of an external force by using a breaking tool is necessary in order to divide the substrate.

The substrate can be divided by the removal of substrate material along the at least one division line, thus reliably preventing any shift of the resulting separated parts of the substrate, such as chips or dies, relative to each other and enabling control of the outer shape, i.e., the side surfaces, of these parts with a high degree of accuracy. Moreover, a complete separation of these parts from each other can be reliably and efficiently ensured, so that no subsequent wafer inspection is required.

Hence, the processing method of the invention allows for the substrate to be processed in an accurate, reliable and efficient manner.

A plurality of division lines may be formed on the first surface of the substrate. The method may comprise applying a pulsed laser beam to the substrate from the side of the first surface, at least in a plurality of positions along one or more, preferably all, of the division lines. In this case, plurality of modified regions is formed in the substrate at least in a plurality of positions along the one or more, preferably all, of the division lines. Subsequently, substrate material may be removed along the one or more, preferably all, of the division lines where the plurality of modified regions has been formed.

The pulsed laser beam may have a wavelength which allows transmission of the laser beam through the substrate.

The pulsed laser beam may be applied to the substrate at least in a plurality of positions along the at least one division line in such a manner that adjacent ones of the positions do not overlap each other.

The pulsed laser beam may be applied to the substrate at least in a plurality of positions along the at least one division line in such a manner that a distance between adjacent ones of the positions, i.e., a distance between centres of adjacent positions, is within a range of 3 μm to 50 μm, preferably 5 μm to 40 μm and more preferably 8 μm to 30 μm. The plurality of modified regions may be formed in the substrate so that a distance between centres of adjacent modified regions in the extension direction of the at least one division line is in the range of 3 μm to 50 μm, preferably 5 μm to 40 μm and more preferably 8 μm to 30 μm. Particularly preferably, the distance between centres of adjacent modified regions in the extension direction of the at least one division line is in the range of 8 μm to 10 μm.

The modified regions may be equidistantly spaced in the extension direction of the at least one division line. Alternatively, some or all of adjacent or neighbouring modified regions may have different distances from each other in the extension direction of the at least one division line.

The diameters of the modified regions may be substantially constant along the direction from the first surface towards the second surface of the substrate.

The modified regions may have diameters or widths in the range of 10 μm to 100 μm, preferably 10 μm to 80 μm and more preferably 10 μm to 50 μm.

The plurality of modified regions may be formed in the substrate so that adjacent or neighbouring modified regions do not overlap each other. In this way, it can be particularly reliably ensured that the substrate maintains a sufficient degree of strength or robustness for allowing efficient further handling and/or processing thereof, in particular, in the step of removing substrate material along the at least one division line.

The plurality of modified regions may be formed in the substrate so that adjacent or neighbouring modified regions do not overlap each other in the extension direction of the at least one division line and/or in the direction perpendicular to the extension direction of the at least one division line.

Preferably, the distance between outer edges of adjacent or neighbouring modified regions in the width direction of the at least one division line and/or in the extension direction of the at least one division line is at least 1 μm.

The plurality of modified regions may be formed in the substrate so that adjacent or neighbouring modified regions at least partially overlap each other. In some embodiments, adjacent or neighbouring modified regions only overlap each other along a part of the extension of the modified regions along the thickness of the substrate. For example, adjacent or neighbouring modified regions may only overlap each other along a part of the extension of the modified regions along the thickness of the substrate which is closer to the first surface of the substrate. Adjacent or neighbouring modified regions may be configured so as not to overlap each other along a part of the extension of the modified regions along the thickness of the substrate which is closer to the second surface of the substrate.

The plurality of modified regions may be formed in the substrate so that adjacent or neighbouring modified regions at least partially overlap each other in the extension direction of the at least one division line and/or in the direction perpendicular to the extension direction of the at least one division line.

Adjacent or neighbouring modified regions may be formed to at least partially overlap each other such that a modified area, in particular, a substantially continuous modified area, is formed. The modified area may be substantially continuous in the extension direction of the at least one division line and/or in the direction perpendicular to the extension direction of the at least one division line. In this way, the removal of substrate material, in particular, the mechanical cutting of the substrate, along the at least one division line can be performed in an especially efficient manner, in particular, with a particularly high processing speed.

The plurality of modified regions may be formed in the substrate so that adjacent or neighbouring modified regions do not overlap each other in the extension direction of the at least one division line but at least partially overlap each other in the direction perpendicular to the extension direction of the at least one division line.

The plurality of modified regions may be formed in the substrate so that adjacent or neighbouring modified regions at least partially overlap each other in the extension direction of the at least one division line but do not overlap each other in the direction perpendicular to the extension direction of the at least one division line.

Some or all of the modified regions may have a substantially cylindrical shape or a tapered shape.

Some or all of the modified regions may substantially have the shape of a cylinder with the longitudinal cylinder axis arranged along the direction from the first surface towards the second surface of the substrate. In this case, the diameters of the modified regions are substantially constant along the direction from the first surface towards the second surface of the substrate.

Some or all of the modified regions may have a tapered shape, wherein the modified regions taper along their extension along the thickness of the substrate. The modified regions may taper along the direction from the first surface towards the second surface of the substrate. In this case, the diameters of the modified regions decrease in the direction from the first surface towards the second surface of the substrate.

In some embodiments of the method according to the present invention, each modified region is formed by melting substrate material by means of the pulsed laser beam and allowing the molten substrate material to resolidify, without forming any openings open to the first surface or the second surface. In this case, each modified region is formed, by melting substrate material and allowing the molten substrate material to resolidify, in such a manner that no openings are formed in the first surface and in the second surface. No opening open to the first surface is formed and no opening open to the second surface is formed. Hence, no openings are present in the first surface and no openings are present in the second surface.

Some or all of the modified regions may extend beyond the first surface of the substrate. Some or all of the modified regions may extend beyond a plane in which the first surface lies. The term "first surface" defines the first surface of the substrate in the state, i.e., in the extension, prior to the application of the pulsed laser beam.

Some or all of the modified regions may extend beyond the second surface of the substrate. Some or all of the modified regions may extend beyond a plane in which the second surface lies. The term "second surface" defines the second surface of the substrate in the state, i.e., in the extension, prior to the application of the pulsed laser beam.

The melting of substrate material by means of the pulsed laser beam and the subsequent resolidification of the molten substrate material may increase the volume of the substrate material. Thus, the substrate material may expand, so that the resolidified substrate material extends beyond the first surface and/or the second surface of the substrate.

The pulsed laser beam may be applied to the substrate in a condition where a focal point of the pulsed laser beam is located on the first surface or at a distance from the first surface in the direction from the first surface towards the second surface.

The substrate may be made of a material which is transparent to the pulsed laser beam. In this case, the plurality of modified regions are formed in the substrate by the application of a pulsed laser beam having a wavelength that allows transmission of the laser beam through the substrate.

The pulsed laser beam may be applied to the substrate in a condition where a focal point of the pulsed laser beam is located on the first surface or at a distance from the first surface in the direction opposite to the direction from the first surface towards the second surface. In this case, the pulsed laser beam is applied to the substrate in a condition where the focal point of the pulsed laser beam is located on the first surface or at a distance from the first surface in the direction from the first surface away from the second surface.

The plurality of modified regions may be formed in the substrate by the application of a pulsed laser beam having such a wavelength that it is absorbed by the substrate material. This approach is particularly efficient for processing a silicon carbide (SiC) substrate, such as a SiC wafer.

An aspect ratio of a modified region is defined as the diameter of the modified region divided by the extension of the modified region along the thickness of the substrate, i.e., the length along which the modified region extends in the thickness direction of the substrate. The modified regions may have aspect ratios of 1:5 or less, preferably 1:10 or less and more preferably 1:20 or less. An aspect ratio of approximately 1:5 allows for a particularly simple process set-up to be used. For an aspect ratio of approximately 1:20 or less, the modified regions can be formed in a particularly efficient manner.

The modified regions may have diameters of 17.5 µm or more, preferably 35 µm or more, and more preferably 70 µm or more. In this way, an extension of the modified regions along the thickness of the substrate of 350 µm or more can be efficiently and reliably achieved with the above-identified aspect ratios of the modified regions.

The substrate may be a single crystal substrate or a compound substrate, such as a compound semiconductor substrate, e.g., a GaAs substrate, or a polycrystalline substrate, such as a ceramic substrate. In particularly preferred embodiments, the substrate is a single crystal substrate.

The modified region is a region of the substrate which has been modified by the application of the pulsed laser beam. For example, the modified region may be a region of the substrate in which the structure of the substrate material has been modified by the application of the pulsed laser beam.

In the method of the present invention, the region of the substrate is modified by melting substrate material by means of the pulsed laser beam and allowing the molten substrate material to resolidify.

The modified region may comprise an amorphous region. The modified region may be an amorphous region.

In some embodiments of the method of the present invention, the substrate is a single crystal substrate, and the method comprises applying a pulsed laser beam to the single crystal substrate from the side of the first surface, at least in a plurality of positions along the at least one division line, so as to form a plurality of modified regions in the single crystal substrate, each modified region extending at least from the first surface towards the second surface, wherein each modified region is formed by melting substrate material by means of the pulsed laser beam and allowing the molten substrate material to resolidify, and removing substrate material along the at least one division line where the plurality of modified regions has been formed. The modified regions may comprise or be amorphous regions. The modified regions, in particular, the amorphous regions, render the substrate more fragile in the area where the plurality of modified regions has been formed, thus further facilitating the process of removing substrate material.

In some embodiments of the method of the present invention, the substrate is a compound substrate or a polycrystalline substrate, and the method comprises applying a pulsed laser beam to the substrate from the side of the first surface, at least in a plurality of positions along the at least one division line, so as to form a plurality of modified regions in the substrate, each modified region extending at least from the first surface towards the second surface, wherein each modified region is formed by melting substrate material by means of the pulsed laser beam and allowing the molten substrate material to resolidify, and removing substrate material along the at least one division line where the plurality of modified regions has been formed. The modified regions may comprise or be amorphous regions. The modified regions, in particular, the amorphous regions, render the substrate more fragile in the area where the plurality of modified regions has been formed, thus further facilitating the process of removing substrate material.

The substrate material may be removed by cutting the substrate along the at least one division line where the plurality of modified regions has been formed. The substrate may be cut, for example, by using a mechanical cutting means, such as a blade or a saw, by laser cutting, by plasma cutting, e.g., using a plasma source, etc. Cutting the substrate is a particularly efficient, simple and reliable way of removing the substrate material along the at least one division line.

The substrate material may be mechanically removed along the at least one division line where the plurality of modified regions has been formed. In particular, the substrate material may be mechanically removed by mechanically cutting the substrate along the at least one division line where the plurality of modified regions has been formed. For this purpose, a mechanical cutting means, such as a blade or a saw, may be used.

As has been detailed above, the formation of the plurality of modified regions along the at least one division line reduces the strength of the substrate in the areas where the modified regions are formed. Hence, the mechanical removal of substrate material, in particular, the mechanical cutting of the substrate, along the at least one division line can be performed in a more efficient manner, in particular, with an increased processing speed. For example, for the case of a blade or saw dicing process, the blade or saw dicing speed can be significantly increased.

Some or all of the modified regions may be formed so as to extend along only a part of the thickness, in the direction from the first surface towards the second surface, of the substrate. In this case, the modified regions extend all the way to, i.e., reach, the first surface but do not extend all the way to, i.e., reach, the second surface of the substrate. Some or all of the modified regions may be formed so as to extend along 30% or more, preferably 40% or more, more preferably 50% or more, even more preferably 60% or more and yet even more preferably 70% or more of the thickness of the substrate.

Some or all of the modified regions may be formed so that the difference between the extension of the modified regions along the thickness of the substrate and the depth to which the substrate material is removed in the substrate material removing step, divided by the extension of the modified regions along the thickness of the substrate, is in the range of −10% to +20%, preferably 0% to +20% and more preferably +10% to +20%.

Some or all of the modified regions may be formed so as to extend at least along the entire thickness of the substrate. In this case, the modified regions extend all the way to the first surface and all the way to the second surface of the substrate.

Forming the modified regions with a large extension along the thickness of the substrate, e.g., so as to extend at least along the entire thickness thereof, is particularly preferable in view of an enhanced service life of a means used for the removal of substrate material, in particular, a blade or a saw.

The amount of the extension of some or all of the modified regions along the thickness of the substrate can be appropriately chosen, e.g., depending on whether it is intended to fully or partially cut the substrate along the thickness thereof.

The amount of extension of the modified regions along the thickness of the substrate can be accurately controlled, for example, by locating the focal point of the pulsed laser beam at an appropriate distance from the first surface in the direction from the first surface towards the second surface or at an appropriate distance from the first surface in the direction opposite to the direction from the first surface towards the second surface.

In the step of removing substrate material along the at least one division line where the plurality of modified regions has been formed, the substrate material may be removed along only a part of the thickness, in the direction from the first surface towards the second surface, of the substrate. The substrate material may be removed along 30% or more, preferably 40% or more, more preferably 50% or more, even more preferably 60% or more and yet even more preferably 70% or more of the thickness of the substrate.

The substrate material may be removed in such a way that the difference between the extension of the modified regions along the thickness of the substrate and the depth to which the substrate material is removed, divided by the extension of the modified regions along the thickness of the substrate, is in the range of −10% to +20%, preferably 0% to +20% and more preferably +10% to +20%.

The substrate material may be removed along the entire thickness of the substrate. In this way, the substrate is divided along the at least one division line by the substrate material removing process.

A substrate material removal width, in the direction substantially perpendicular to the extension direction of the at least one division line, e.g., a cutting width, may be varied in the substrate material removing process. For example, the substrate material may be removed along a part of the substrate thickness with a first removal width and another part, e.g., the remaining part, of the substrate material in the thickness direction of the substrate may be removed with a second removal width. The second removal width may be smaller than the first removal width.

For example, for this purpose, two different cutting means having different widths in the direction substantially perpendicular to the extension direction of the at least one division line can be used.

The method of the present invention may further comprise grinding the second surface of the substrate to adjust the substrate thickness. In this case, it is particularly preferable to form the modified regions so as to extend at least along the entire thickness of the substrate. In this way, the second surface side of the substrate is reduced in strength, thus allowing for the grinding process to be performed more efficiently, in particular, with a higher grinding speed.

Grinding the second surface of the substrate may be performed before removing the substrate material along the at least one division line where the plurality of modified regions has been formed.

Grinding the second surface of the substrate may be performed after removing the substrate material along the at least one division line where the plurality of modified regions has been formed.

In particular, in the step of removing substrate material along the at least one division line, the substrate material may be removed along only a part of the thickness of the substrate. Subsequently, grinding of the second surface of the substrate may be performed after the substrate material removal along the at least one division line.

The grinding may be carried out in such a way as to reduce the substrate thickness to a thickness that corresponds to the depth at which the substrate material has been removed along the at least one division line, for example, to the cutting depth of a cutting process. In this case, the substrate material which had not been reached by the substrate material removing process along the at least one division line is removed in the grinding step, so that the substrate is divided along the at least one division line by the grinding process.

Grinding of the second surface of the substrate may thus be performed along a remaining part of the thickness of the substrate, in which no substrate material has been removed, so as to divide the substrate along the at least one division line.

By dividing the substrate in the grinding step in the manner detailed above, the substrate can be processed in a particularly reliable, accurate and efficient manner. Specifically, the step of removing substrate material along the at least one division line is performed on the substrate before grinding, i.e., before a reduction in thickness thereof. Hence, any deformation of the substrate during material removal, e.g., during cutting, along the at least one division line, such as substrate warpage or the like, can be reliably avoided. Further, the stress applied to the substrate during substrate material removal along the at least one division line is significantly reduced, allowing for chips or dies with an increased die strength to be obtained. Any damage to the resulting chips or dies, such as the formation of cracks or back side chipping, can be prevented.

Moreover, since the substrate material is removed along the at least one division line only along a part of the substrate thickness, the efficiency, in particular, the processing speed, of the substrate material removal process is enhanced. Also, the service life of a means, e.g., a cutting means, used for the substrate material removing step is extended.

For the case of removing the substrate material along only a part of the thickness of the substrate and subsequently grinding the second surface of the substrate in the manner described above, so as to divide the substrate along the at least one division line, it is particularly preferable to form the modified regions so as to extend at least along the entire thickness of the substrate. As has been detailed above, in this way, the efficiencies of both the step of substrate material removal along the at least one division line and the grinding step can be significantly enhanced.

In the step of removing substrate material along the at least one division line, the substrate material may be removed along the entire extension, in the direction from the first surface towards the second surface, of the modified regions, or along only a part of this extension. The substrate material may be removed along 30% or more, preferably 40% or more, more preferably 50% or more, even more preferably 60% or more and yet even more preferably 70 t or more of the extension of the modified regions.

The at least one division line formed on the first surface of the substrate may have a width in a direction substantially perpendicular to the extension direction of the at least one division line.

The width of the at least one division line may be in the range of 30 μm to 200 μm, preferably 30 μm to 150 μm and more preferably 30 μm to 100 μm.

The pulsed laser beam may be applied to the substrate from the side of the first surface also in a plurality of positions along the width direction of the at least one division line.

A plurality of modified regions may be formed within the width of the at least one division line.

Adjacent or neighbouring modified regions may be equidistantly spaced in the width direction of the at least one division line. Alternatively, some or all of adjacent or neighbouring modified regions may have different distances from each other in the width direction of the at least one division line. The modified regions may be substantially randomly arranged in the extension direction and/or the width direction of the at least one division line.

The distances between adjacent modified regions in the width direction of the at least one division line, i.e., between centres of adjacent modified regions, may be in the range of 3 μm to 50 μm, preferably 5 μm to 40 μm and more preferably 8 μm to 30 μm.

The pulsed laser beam may be applied also in a plurality of positions along the width direction of the at least one division line, so as to form within the width of the at least one division line a plurality of rows of modified regions, each row extending along the extension direction of the at least one division line. The rows may be arranged adjacent to each other in the width direction of the at least one division line. The rows may be equidistantly spaced in the width direction of the at least one division line or some or all of adjacent rows may have different distances from each other in the width direction of the at least one division line.

The distance between adjacent rows of modified regions in the width direction of the at least one division line, i.e., between centres of the modified regions of the adjacent rows, may be in the range of 3 μm to 50 μm, preferably 5 μm to 40 μm and more preferably 8 μm to 30 μm. The number of rows may be in the range of 1 to 3, preferably 1 or 2.

The modified regions may be formed so that adjacent or neighbouring modified regions at least partially overlap each other in the extension direction of the at least one division line and/or in the width direction of the at least one division line.

Adjacent or neighbouring modified regions may be formed to at least partially overlap each other such that a modified area, in particular, a substantially continuous modified area, is formed. The modified area may be substantially continuous in the extension direction of the at least one division line and/or in the width direction of the at least one division line.

The modified regions may be formed so that adjacent or neighbouring modified regions do not overlap each other in the extension direction of the at least one division line and/or in the width direction of the at least one division line.

Particularly preferably, a single row of modified regions or a single modified area may be formed within the width of the at least one division line. For example, the modified regions or the modified area may have diameters or widths in the range of 10 μm to 100 μm, preferably 10 μm to 80 μm and more preferably 10 μm to 50 μm.

For the case of a single row of modified regions, substrate processing can be carried out in a particularly efficient manner at an increased processing speed.

In the single row of modified regions, the modified regions may be formed so that adjacent or neighbouring modified regions at least partially overlap each other in the extension direction of the at least one division line. In this way, a modified area, in particular, a substantially continuous modified area, can be formed, for example, having a width in the width direction of the at least one division line in the range of 10 μm to 100 μm, preferably 10 μm to 80 μm and more preferably 10 μm to 50 μm.

Alternatively, for example, two or three rows of modified regions may be formed within the width of the at least one division line. The modified regions may be formed so that adjacent or neighbouring modified regions at least partially overlap each other in the extension direction of the at least one division line and in the width direction of the at least one division line. In this way, a modified area, in particular, a substantially continuous modified area, can be formed, for example, having a width in the range of 10 μm to 100 μm, preferably 10 μm to 80 μm and more preferably 10 μm to 50 μm.

Alternatively, for example, two or three rows of modified regions may be formed within the width of the at least one division line, and the modified regions may be formed so that adjacent or neighbouring modified regions do not overlap each other in the extension direction of the at least one division line and in the width direction of the at least one division line.

In this way, it can be particularly reliably ensured that the substrate maintains a sufficient degree of strength or robustness for allowing efficient further handling and/or processing thereof, in particular, in the step of removing substrate material along the at least one division line.

By forming within the width of the division line a plurality of rows of modified regions arranged adjacent to each other in the width direction of the division line as detailed above, the process of removing substrate material along the division line, in particular, by using a cutting process, e.g., a mechanical cutting process, can be rendered even more efficient.

Further, a wide variation of means for removing substrate material along the at least one division line, e.g., a wide variation of mechanical cutting means, such as blades or saws, e.g., having different cutting widths, can be used. Moreover, for example, cutting blades or saws with a reduced hardness or strength can be employed, due to the reduced strength of the area of the substrate where the modified regions are formed, allowing for the costs of the cutting means or equipment to be reduced. Also, the service life of the cutting means or equipment can be extended.

The rows of modified regions may be formed in such a manner that the distance between adjacent rows is larger at or closer to the centre of the at least one division line in the width direction of the at least one division line than at positions arranged further away from the centre of the division line in the width direction of the at least one division line, e.g., in edge areas or side areas of the division line. In particular, the rows of modified regions may be present only in these edge areas or side areas of the at least one division line.

By arranging the rows of modified regions in such a manner that the distance between adjacent rows is larger at the centre of the division line than at positions arranged away from the centre of the division line, the process of forming the modified regions can be rendered more efficient, since the number of modified regions can be reduced. Further, since the rows of modified regions are present in the edge or side areas of the at least one division line, any damage to the side surfaces of the obtained divided parts of the substrate, such as chips or dies, in the cutting process, e.g., by chipping or cracking, can be reduced.

The substrate material may be removed along the at least one division line where the plurality of modified regions has been formed by mechanically cutting the substrate using a cutting means.

A width, in the direction substantially perpendicular to the extension direction of the at least one division line, of an area of the substrate in which the row or rows of modified regions have been formed may be smaller than a width, in the direction substantially perpendicular to the extension direction of the at least one division line, of the cutting means. The area of the substrate in which the rows of modified regions have been formed is the area of the substrate between the two outermost rows of modified regions in the width direction of the at least one division line.

In this way, it can be reliably ensured that, in the process of mechanically cutting the substrate, the entire area of the substrate in which the modified regions have been formed can be removed. Hence, a particularly high quality of the outer or side surfaces of the substrate parts, such as chips or dies, obtained in the process of dividing the substrate can be achieved.

The width, in the direction substantially perpendicular to the extension direction of the at least one division line, of the area of the substrate in which the row or rows of modified regions have been formed may be larger than the width, in the direction substantially perpendicular to the extension direction of the at least one division line, of the cutting means. In this way, the cutting process can be performed in a particularly efficient and quick manner. Modified regions remaining on the separated parts of the substrate after the cutting process may be subsequently removed, e.g., by polishing the outer or side surfaces of the resulting substrate parts, e.g., chips or dies.

The width of the area of the substrate in which the row or rows of modified regions have been formed may be in a range of approximately 80% to 120%, preferably 90% to 110% and more preferably 95% to 105% of the width of the cutting means. In this way, it can be ensured that the cutting process can be carried out in an efficient manner, while obtaining separated substrate parts, such as chips or dies, with a good quality of the outer or side surfaces thereof.

The width of the cutting means may be in a range of approximately 80% to 120%, preferably 90% to 110% and more preferably 95% to 105% of the width of the area of the substrate in which the row or rows of modified regions have been formed.

The width of the area of the substrate in which the row or rows of modified regions have been formed may be in a range of approximately 80% to 120%, preferably 80% to 110%, more preferably 80% to 105%, even more preferably 90% to 105%, and yet even more preferably 95% to 105% of the width of the at least one division line.

A row or rows of modified regions arranged closer to the centre of the at least one division line, in the width direction of the at least one division line, may be formed with a pulsed laser beam having a higher power than a pulsed laser beam used for forming a row or rows of modified regions arranged further away from the centre of the at least one division line, in the width direction of the at least one division line. In this way, the efficiency of the process of removing substrate material along the at least one division line, in particular, by cutting, e.g., mechanical cutting, can be further enhanced.

The substrate may be made of a material which is transparent to the pulsed laser beam. In this case, the plurality of modified regions are formed in the substrate by the application of a pulsed laser beam having a wavelength that allows transmission of the laser beam through the substrate.

Alternatively, the plurality of modified regions may be formed in the substrate by the application of a pulsed laser beam having such a wavelength that it is absorbed by the substrate material.

For example, if the substrate is a silicon (Si) substrate, the pulsed laser beam may have a wavelength of 1064 nm or less.

The pulsed laser beam may have a pulse width, for example, in the range of 200 ns or less.

The substrate may be, for example, a semiconductor substrate, a sapphire ($Al_2O_3$) substrate, a ceramic substrate, such as an alumina ceramic substrate, a quartz substrate, a zirconia substrate, a PZT (lead zirconate titanate) substrate, a polycarbonate substrate, an optical crystal material substrate or the like.

In particular, the substrate may be, for example, a silicon (Si) substrate, a gallium arsenide (GaAs) substrate, a gallium nitride (GaN) substrate, a gallium phosphide (GaP) substrate, an indium arsenide (InAs) substrate, an indium phosphide (InP) substrate, a silicon carbide (SiC) substrate, a silicon nitride (SiN) substrate, a lithium tantalate (LT) substrate, a lithium niobate (LN) substrate, a sapphire ($Al_2O_3$) substrate, an aluminium nitride (AlN) substrate, a silicon oxide ($SiO_2$) substrate or the like.

The substrate may be made of a single material or of a combination of different materials, e.g., two or more of the above-identified materials.

The pulsed laser beam may be focused using a focusing lens. A numerical aperture (NA) of the focusing lens may be set so that the value obtained by dividing the numerical aperture of the focusing lens by the refractive index (n) of the substrate is in the range of 0.05 to 0.2. In this way, the modified regions can be formed in a particularly reliable and efficient manner.

BRIEF DESCRIPTION OF THE DRAWINGS

Hereinafter, non-limiting examples of the invention are explained with reference to the drawings, in which:

FIG. 1 shows an optical device wafer as a substrate to be processed by the method of the invention, wherein FIG. 1(a) is a perspective view of the wafer, and FIG. 1(b) is an enlarged view of the encircled region A in FIG. 1(a);

FIG. 6 shows a process of dividing the optical device wafer according to an embodiment of the processing method of the present invention, wherein FIGS. 6(a) and 6(b) are cross-sectional views illustrating a step of removing substrate material along a division line, and FIG. 6(c) is a cross-sectional view illustrating a grinding step;

FIG. 7 shows steps of removing substrate material along a division line for two different embodiments of the present invention, wherein FIGS. 7(a) and 7(b) are cross-sectional views illustrating the substrate material removing step for one embodiment, and FIGS. 7(c) and 7(d) are cross-sectional views illustrating the substrate material removing step for another embodiment;

DETAILED DESCRIPTION OF PREFERRED EMBODIMENTS

Preferred embodiments of the present invention will now be described with reference to the accompanying drawings.

The preferred embodiments relate to methods of processing an optical device wafer as a substrate.

The optical device wafer may have a thickness before grinding in the µm range, preferably in the range of 200 µm to 1500 µm.

Figure 1:
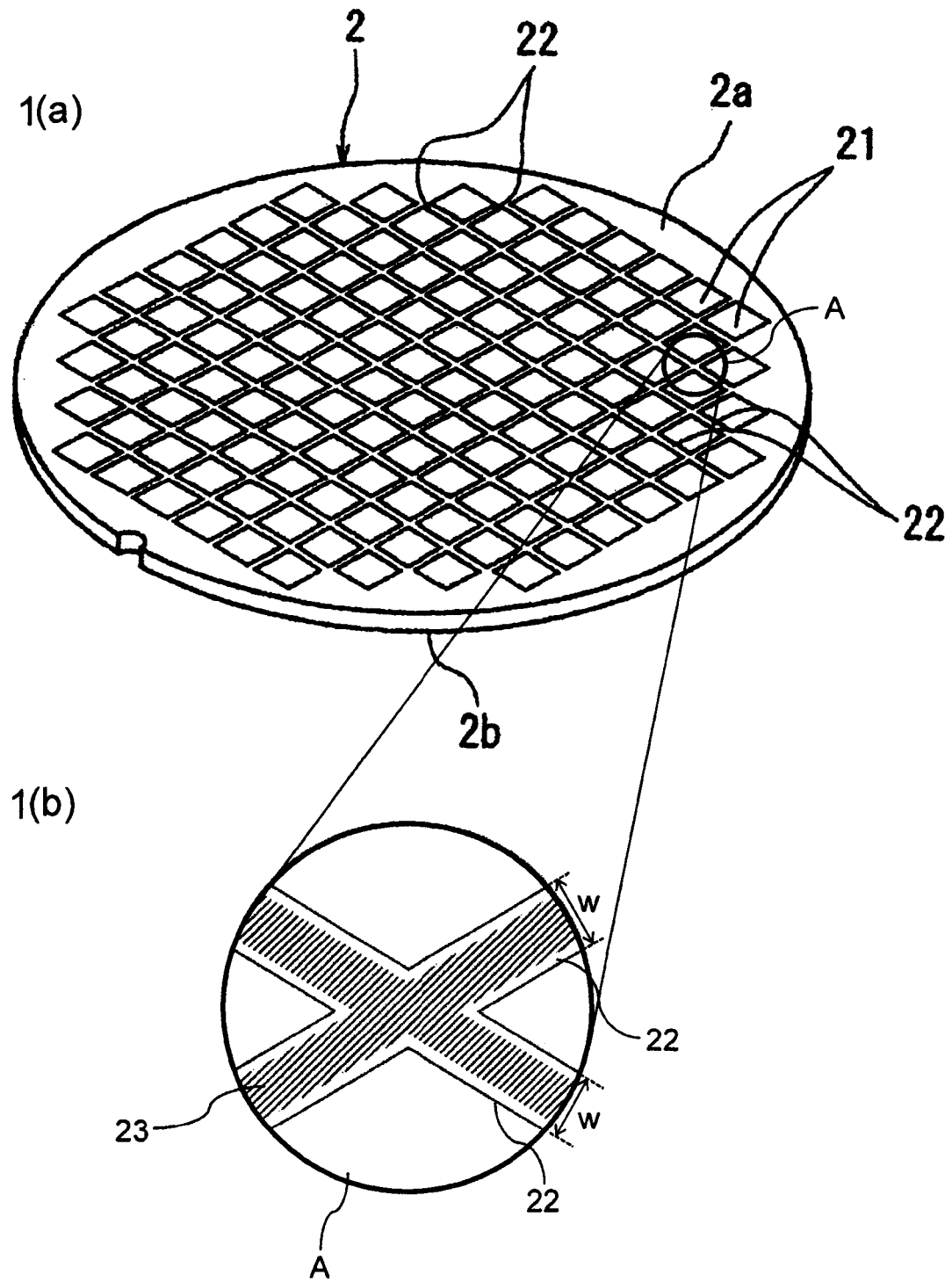

FIG. 1(a) is a perspective view of an optical device wafer 2 as a substrate to be processed by the processing method of the present invention. The optical device wafer 2 is a single crystal substrate.

In other embodiments, the substrate to be processed by the processing method of the present invention may be a compound substrate, such as a compound semiconductor substrate, e.g., a GaAs substrate, or a polycrystalline substrate, such as a ceramic substrate.

The optical device wafer 2 shown in FIG. 1(a) is substantially composed of a sapphire substrate with a thickness of, for example, 300 µm. A plurality of optical devices 21, such as light emitting diodes (LEDs) and laser diodes, are formed on a front side 2a, i.e., a first surface, of the sapphire substrate. The optical devices 21 are provided on the front side 2a of the sapphire substrate in a grid or matrix arrangement. The optical devices 21 are separated by a plurality of crossing division lines 22 formed on the front side 2a of the sapphire substrate, i.e., on the front side of the optical device wafer 2.

In the following, a preferred embodiment of the method of the present invention for processing the optical device wafer 2 as the substrate will be described with reference to FIGS. 2 to 6(c).

Figure 2:
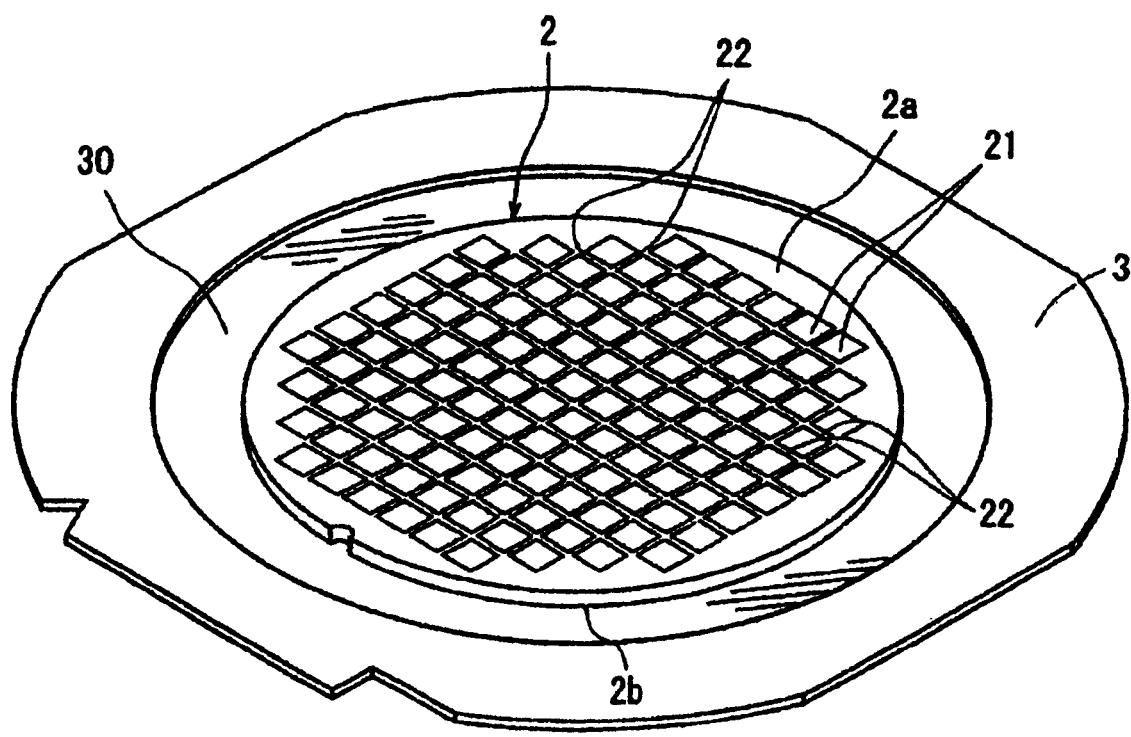
FIG. 2 is a perspective view showing a condition in which the optical device wafer of FIG. 1(a) is attached to an adhesive tape supported by an annular frame.

First, a wafer supporting step is performed in such a manner that the optical device wafer 2 is attached to an adhesive tape, such as a dicing tape, supported by an annular frame. Specifically, as is shown in FIG. 2, an adhesive tape 30, e.g., a dicing tape, is supported at a peripheral portion thereof by an annular frame 3, so as to close an inner opening of the annular frame 3 by the adhesive tape 30. A back side 2b, i.e., a second surface, of the optical device wafer 2 is attached to the adhesive tape 30. Accordingly, the front side 2a of the optical device wafer 2 attached to the adhesive tape 30 is oriented upwards, as is shown in FIG. 2.

Figure 3:
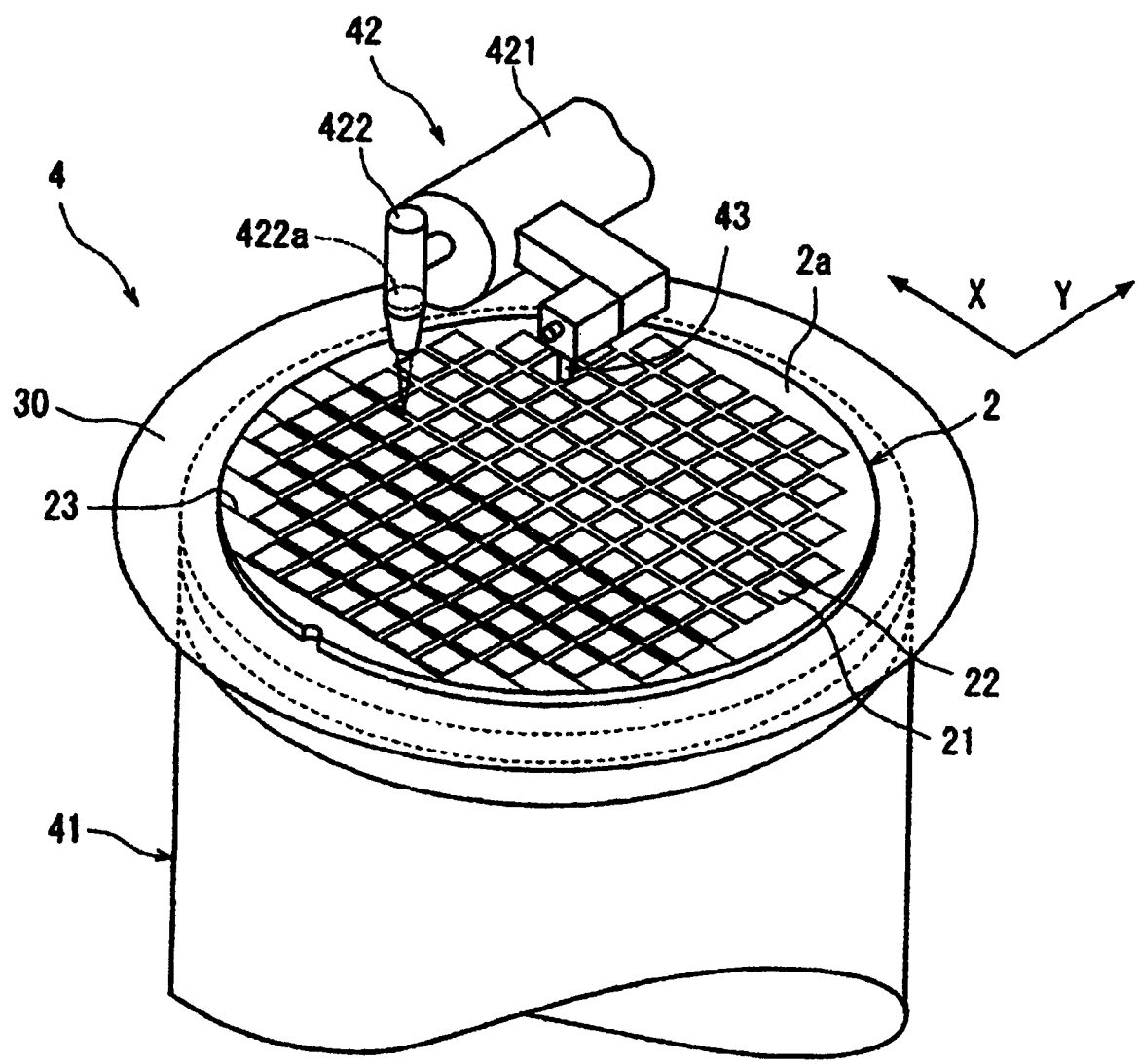
FIG. 3 is a perspective view of a part of a laser processing apparatus for applying a pulsed laser beam to the optical device wafer of FIG. 1(a)

FIG. 3 shows a part of a laser processing apparatus 4 for performing laser processing along the division lines 22 on the optical device wafer 2 after carrying out the wafer supporting step described above. As is shown in FIG. 3, the laser processing apparatus 4 includes a chuck table 41 for holding a workpiece, in particular, the optical device wafer 2, a laser beam applying means 42 for applying a laser beam to the workpiece held on the chuck table 41, and an imaging means 43 for imaging the workpiece held on the chuck table 41. The chuck table 41 has an upper surface as a holding surface for holding the workpiece thereon under suction. The chuck table 41 is movable by a feeding means (not shown) in a feeding direction which is indicated in FIG. 3 by an arrow X. Further, the chuck table 41 is movable by an indexing means (not shown) in an indexing direction which is indicated in FIG. 3 by an arrow Y.

The laser beam applying means 42 includes a cylindrical casing 421 extending in a substantially horizontal direction. The casing 421 contains a pulsed laser beam oscillating means (not shown) including a pulsed laser oscillator and a repetition frequency setting means. Further, the laser beam applying means 42 includes a focusing means 422 mounted on a front end of the casing 421. The focusing means 422 comprises a focusing lens 422a for focusing a pulsed laser beam oscillated by the pulsed laser beam oscillating means.

The numerical aperture (NA) of the focusing lens 422a of the focusing means 422 may be set so that the value obtained by dividing the numerical aperture of the focusing lens 422a by the refractive index (n) of the single crystal substrate is within the range of 0.05 to 0.2.

The laser beam applying means 42 further includes a focal position adjusting means (not shown) for adjusting the focal position of the pulsed laser beam to be focused by the focusing lens 422a of the focusing means 422.

The imaging means 43 is mounted on a front end portion of the casing 421 of the laser beam applying means 42. The imaging means 43 includes an ordinary imaging device (not shown), such as a CCD, for imaging the workpiece by using visible light, an infrared light applying means (not shown) for applying infrared light to the workpiece, an optical system (not shown) for capturing the infrared light applied to the workpiece by the infrared light applying means, and an infrared imaging device (not shown), such as an infrared CCD, for outputting an electrical signal corresponding to the infrared light captured by the optical system. An image signal output from the imaging means 43 is transmitted to a control means (not shown).

When performing laser processing along the division lines 22 of the optical device wafer 2 by using the laser processing apparatus 4, a positioning step is performed in such a manner that the focusing lens 422a of the focusing means 422 and the single crystal substrate, i.e., the optical device wafer 2, are positioned relative to each other in the direction along the optical axis of the focusing lens 422a so that the focal point of the pulsed laser beam is located at a desired position in the direction along the thickness of the optical device wafer 2, i.e., at a desired distance from the front side 2a, i.e., the first surface, in the direction from the front side 2a towards the back side 2b, i.e., the second surface.

In other embodiments, the focal point of the pulsed laser beam may be located on the front side 2a or at a desired distance from the front side 2a in the direction opposite to the direction from the front side 2a towards the back side 2b (see FIG. 5(a)).

When performing the processing method according to the current embodiment of the present invention, the optical device wafer 2 attached to the adhesive tape 30 is first placed on the chuck table 41 of the laser processing apparatus 4 shown in FIG. 3 in the condition where the adhesive tape 30 is in contact with the upper surface of the chuck table 41 (see FIG. 3). Subsequently, a suction means (not shown) is operated to hold the optical device wafer 2 through the adhesive tape 30 on the chuck table 41 under suction (wafer holding step). Accordingly, the front side 2a of the optical device wafer 2 held on the chuck table 41 is oriented upward. Although, for the purpose of better presentability, the annular frame 3 supporting the adhesive tape 30 is not shown in FIG. 3, the annular frame 3 is held by a frame holding means, such as clamps or the like, provided on the chuck table 41. Subsequently, the chuck table 41 holding the optical device wafer 2 under suction is moved to a position directly below the imaging means 43 by operating the feeding means.

In the condition where the chuck table 41 is positioned directly below the imaging means 43, an alignment operation is performed by the imaging means 43 and the control means (not shown) in order to detect a subject area of the optical device wafer 2 to be laser processed. Specifically, the imaging means 43 and the control means perform image processing, such as pattern matching, in order to align the division lines 22 extending in a first direction on the optical device wafer 2 with the focusing means 422 of the laser beam applying means 42. In this way, alignment of a laser beam applying position is performed (alignment step). This alignment step is performed in a similar manner also for all the other division lines 22 extending in a second direction perpendicular to the first direction on the optical device wafer 2.

Figure 4:
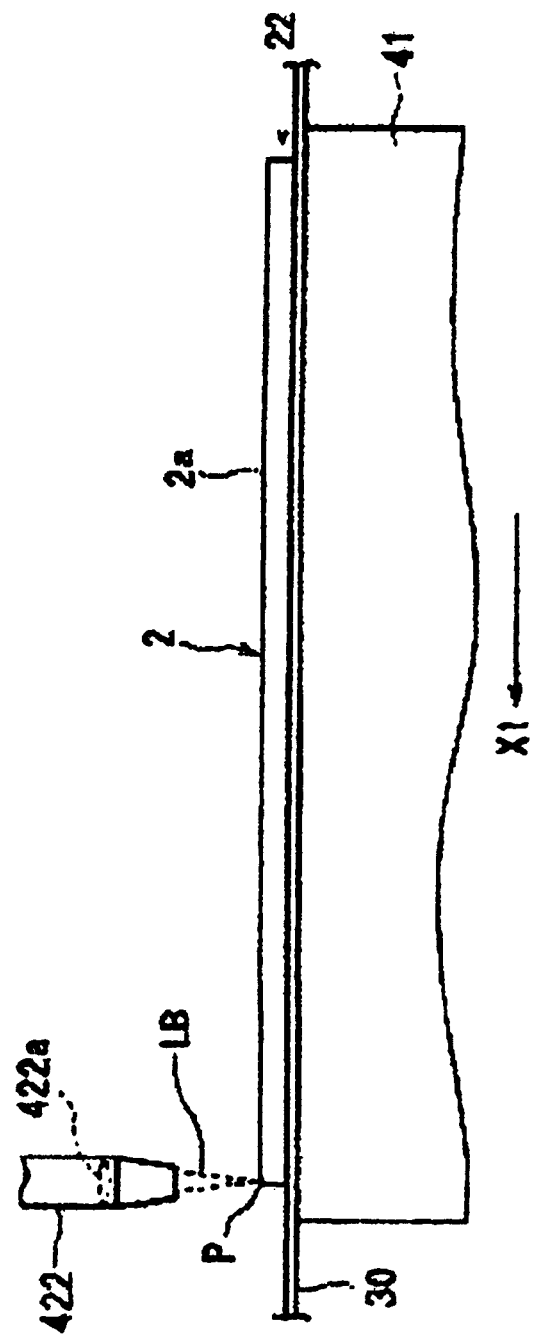
FIG. 4 is a side view for illustrating a step of forming a plurality of modified regions in the optical device wafer of FIG. 1(a) according to an embodiment of the method of the present invention.

After performing the alignment step detailed above for all of the division lines 22 on the front side 2a of the optical device wafer 2, the chuck table 41 is moved to a laser beam applying area where the focusing means 422 of the laser beam applying means 42 is located, as is shown in FIG. 4. One end (the left end in FIG. 4) of a predetermined division line 22 extending in the first direction is positioned directly below the focusing means 422. Further, the focal position adjusting means (not shown) is operated so as to move the focusing means 422 in the direction along the optical axis of the focusing lens 422a so that the focal point P of a pulsed laser beam LB to be focused by the focusing lens 422 is located at a desired distance from the front side 2a of the optical device wafer 2 in the direction from the front side 2a towards the back side 2b thereof, i.e., in the thickness direction of the optical device wafer 2 (positioning step).

In this embodiment, the focal point P of the pulsed laser beam LB is located inside the optical device wafer 2 at a position near the front side 2a, i.e., the upper surface, of the optical device wafer 2 to which the pulsed laser beam LB is applied. For example, the focal point P may be located at a distance from the front side 2a in the range of 5 μm to 10 μm.

After performing the positioning step described above, a modified region forming step is performed in such a manner that the laser beam applying means 42 is operated to apply the pulsed laser LB from the focusing means 422 to the optical device wafer 2, thereby forming a modified region extending from the front side 2a of the optical device wafer 2, where the focal point P of the pulsed LB is located, to the back side 2b of the wafer 2. The modified region is formed by melting substrate material by means of the pulsed laser beam LB and allowing the molten substrate material to resolidify, as will be further detailed below with reference to FIGS. 5(a) to (d).

Specifically, the pulsed laser beam LB, which has a wavelength that allows transmission of the laser beam LB through the sapphire substrate constituting the optical device wafer 2, is applied to the optical device wafer 2 by the focusing means 422, and the chuck table 41 is moved at a predetermined feed speed in the direction indicated by an arrow X1 in FIG. 4 (modified region forming step). When the other end (right end in FIG. 4) of the predetermined division line 22 reaches the position directly below the focusing means 422, the application of the pulsed laser beam LB is stopped and the movement of the chuck table 41 is also stopped.

By performing the modified region forming step detailed above along the predetermined division line 22, a plurality of modified regions 23 (see FIGS. 5(c) and (d)) is formed in the optical device wafer 2 along the division line 22, wherein each modified region 23 is formed by melting substrate material by means of the pulsed laser beam LB and allowing the molten substrate material to resolidify. The modified regions 23 may be formed along the division line 22 at predetermined, equidistant intervals in the extension direction of the division line 22. For example, the distance between adjacent modified regions 23 in the extension direction of the division line 22 may be in the range of 8 μm to 30 μm, e.g., approximately 16 μm (=(work feed speed: 800 mm/second)/(repetition frequency: 50 kHz)). The modified regions 23 may be formed along the division line 22 so that adjacent or neighbouring modified regions 23 at least partially overlap each other in the extension direction of the division line 22.

Figure 9:
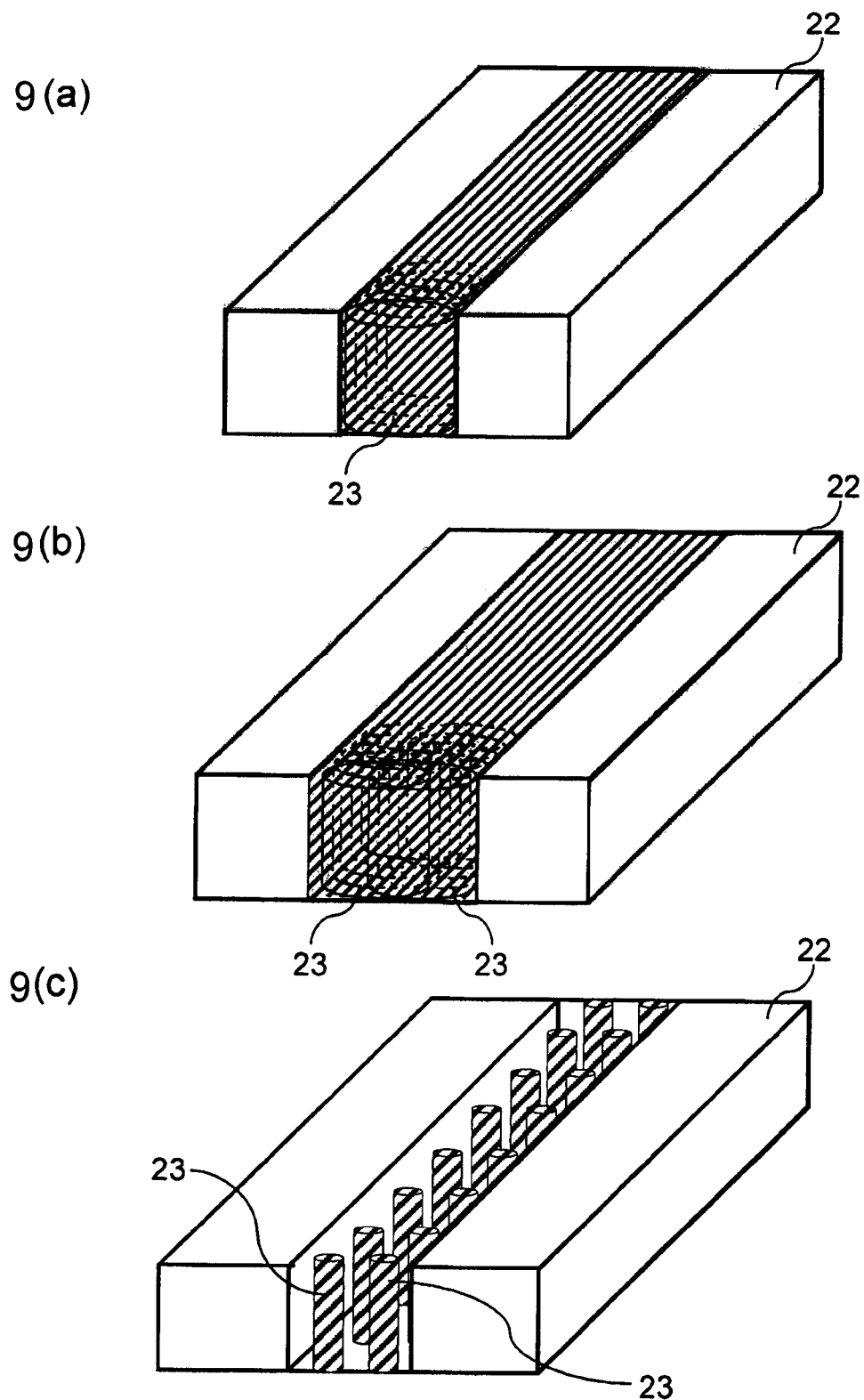
FIGS. 9(a) to 9(c) are schematic perspective views showing examples of arrangements of modified regions within a division line for different embodiments of the method of the present invention.

In this embodiment, adjacent modified regions 23 are formed so as to at least partially overlap each other (in this regard, see, for example, FIGS. 9(a) and (b)). Specifically, the distance between adjacent modified regions 23 is chosen so as to be at least slightly smaller than the outer diameter of the modified regions 23. Adjacent or neighbouring modified regions 23 are thus connected to each other, forming a substantially continuous modified area (see, for example, the hatched areas in FIGS. 1(b), 9(a), 9(b), 10(a) and 10(b)).

Each modified region 23 formed in the modified region forming step detailed above extends from the front side 2a of the optical device wafer 2 to the back side 2b thereof. Accordingly, even when the thickness of the optical device wafer 2 is large, it is sufficient to apply the pulsed laser beam LB once for the formation of each modified region 23, so that the productivity can be greatly enhanced. Furthermore, no debris is scattered in the modified region forming step, so that a degradation of the quality of the resulting devices can be reliably prevented.

The formation of a modified region 23 in the optical device wafer 2 is illustrated in FIGS. 5(a) to 5(d).

In the embodiments shown in these drawings, the pulsed laser beam LB is applied to the wafer 2 from the front side 2a in a condition where the focal point P of the pulsed laser beam LB is located at a distance from the front side 2a in the direction opposite to the direction from the front side 2a towards the back side 2b (see FIG. 5(a)). The focal point P is thus arranged outside the wafer 2. For example, the pulsed laser beam LB may have a wavelength in the infrared range, e.g., 1064 nm.

Figure 5:
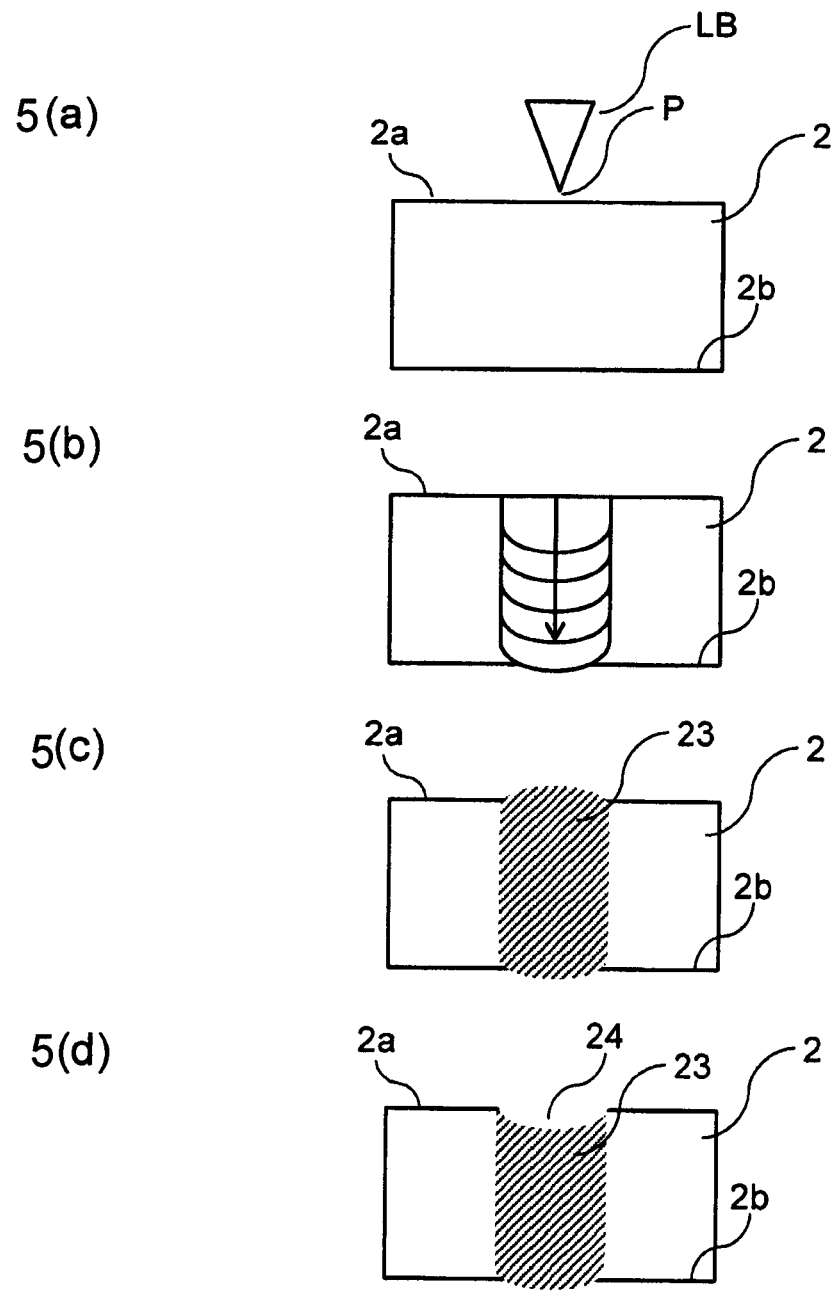
FIGS. 5(a) to 5(d) are schematic cross-sectional views illustrating the formation of a modified region in the optical device wafer of FIG. 1(a)

Due to the application of the pulsed laser beam LB, the wafer material is locally heated up and melted along the entire thickness of the wafer 2, as is indicated by an arrow in FIG. 5 (b).

When the laser beam application is stopped, the molten wafer material is allowed to cool down and thus resolidify, resulting in the formation of the modified region 23 (see FIG. 5(c)). In the embodiment shown in FIG. 5(c), the melting of wafer material by means of the pulsed laser beam LB and the subsequent resolidification of the molten wafer material have increased the volume of the wafer material. Thus, the wafer material has expanded, so that the resolidified wafer material extends beyond the front side 2a and the back side 2b of the wafer 2. The modified region 23 depicted in FIG. 5(c) is an amorphous region which does not have any spaces or cavities formed therein. No openings open to the front side 2a or the back side 2b of the wafer 2 are formed.

FIG. 5(d) shows another embodiment of the modified region 23. This modified region 23 differs from that of FIG. 5(c) in that some wafer material has been evaporated at the wafer front side 2a due to the application of the pulsed laser beam LB, so that an indentation 24 is formed in the modified region 23 at the front side 2a. Also the modified region 23 depicted in FIG. 5(d) is an amorphous region.

The division lines 22 have a width w in a direction substantially perpendicular to the extension direction thereof, as is schematically shown in FIG. 1(b).

The modified region forming step detailed above may be performed along the predetermined division line 22 only once, thus forming a single row of modified regions 23 within the width w of the division line 22.

Alternatively, the modified region forming step detailed above may be performed along the predetermined division line 22 two or more times, in particular, two or three times, while slightly shifting the optical device wafer 2 relative to the laser beam applying means 42 in the indexing direction (indicated by the arrow Y in FIG. 3), so as to apply the pulsed laser beam LB also in a plurality of positions along the width direction of the division line 22. In this way, a plurality of modified regions 23 is formed also along the width direction of the division line 22. The modified regions 23 may be arranged with different distances between adjacent modified regions 23 in the extension direction and/or the width direction of the division line 22.

A single row of modified regions 23 may be formed within the width w of the division line 22.

In other embodiments, a plurality of rows of modified regions 23 may be formed within the width w of the division line 22, each row extending along the extension direction of the division line 22, wherein the rows are arranged adjacent to each other in the width direction of the division line 22. The rows of modified regions 23 may be equidistantly arranged in the width direction of the division line 22. Alternatively, the distances between adjacent rows of modified regions 23 in the width direction of the division line 22 may vary. For example, the distances between adjacent rows of modified regions 23 may be larger at or closer to the centre of the division line 22 than at positions further away from the centre, i.e., at the sides or edges in the width direction of the division line 22.

After performing the modified region forming step only once or a plurality of times along the predetermined division line 22 as detailed above, the chuck table 41 is moved in the indexing direction (indicated by the arrow Y in FIG. 3) by the pitch of the division lines 22 extending in the first direction on the optical device wafer 2 (indexing step). Subsequently, the modified region forming step is performed only once or a plurality of times in the same manner as described above along the next division line 22 extending in the first direction. In this way, the modified region forming step is performed a plurality of times along all of the division lines 22 extending in the first direction. Thereafter, the chuck table 41 is rotated by 90°, in order to perform the modified region forming step only once or a plurality of times in the same manner as detailed above along all of the other division lines 22 extending in the second direction perpendicular to the first direction.

The modified region forming step may be performed using a pulsed laser beam with a wavelength in the range of 300 nm to 3000 nm, a pulse width of 200 ns or less, an average power of 0.2 W to 10.0 W and a repetition frequency of 10 kHz to 80 kHz. The work feed speed with which the optical device wafer 2 is moved relative to the laser beam applying means 42 in the modified region forming step may be in the range of 50 mm/second to 1000 mm/second.

If a semiconductor substrate is used as the substrate, e.g., the single crystal substrate, to be processed by the method of the present invention, a modified region 23 can be formed in a particularly efficient and reliable manner if the wavelength of the pulsed laser beam LB is set to a value which is two or more times the wavelength (reduced wavelength) corresponding to the band gap of the semiconductor substrate.

After performing the modified region forming step in the manner detailed above, a step of dividing the optical device wafer 2 is carried out, as will be described in detail below with reference to FIGS. 6(a) to (c).

FIG. 6(a) shows a cross-sectional view of a part of the optical device wafer 2 including a division line 22. As has been indicated above, a single row or a plurality of rows of modified regions 23 are formed within the width of the division line 22, each row extending along the extension direction of the division line 22. The rows of modified regions 23 may be equidistantly arranged adjacent to each other in the width direction of the division line 22.

Figure 6:
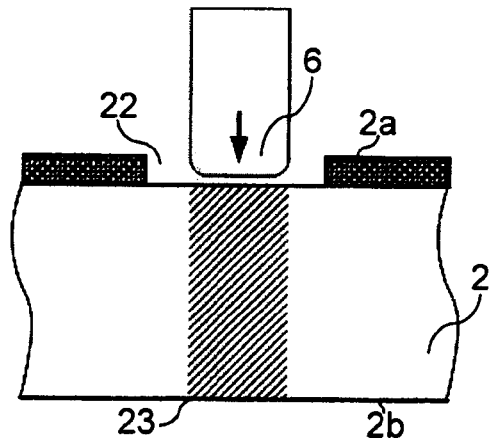
Figure 6:
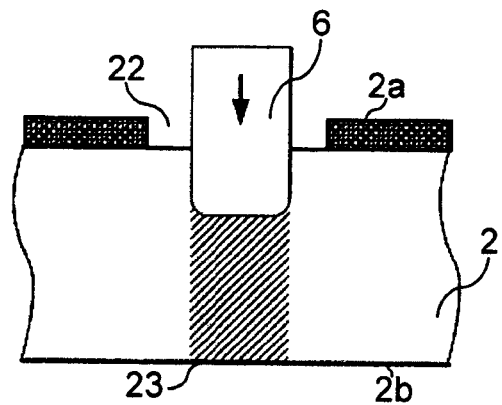
Figure 6:
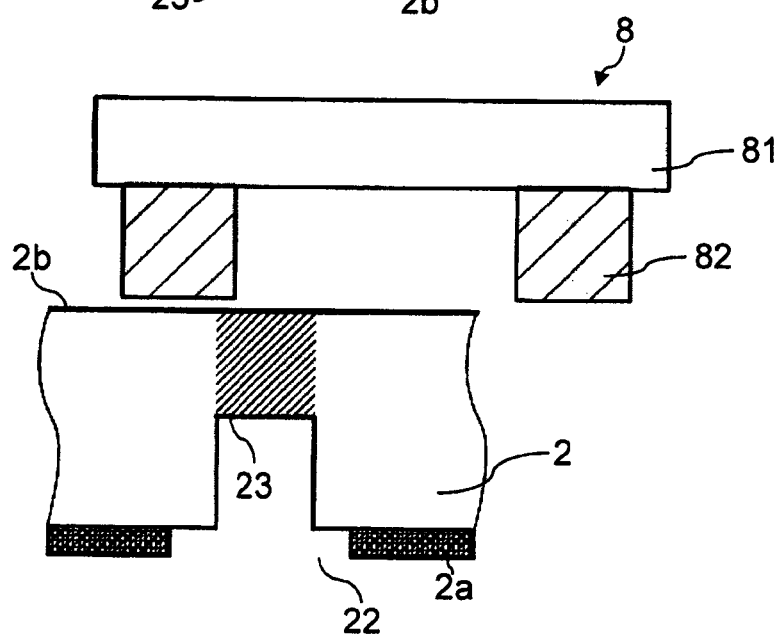

In the embodiment shown in FIG. 6, a single row of modified regions 23 is formed so that adjacent or neighbouring modified regions 23 at least partially overlap each other in the extension direction of the division line 22. In this way, a substantially continuous modified area is formed, as is indicated by the hatched area in FIG. 6. The modified area is substantially continuous in the extension and width directions of the division line 22. This approach will be further detailed below with reference to FIG. 9(*a*).

Alternatively, for example, two or three rows of modified regions 23 may be formed within the width of the division line 22. The modified regions 23 may be formed so that adjacent or neighbouring modified regions at least partially overlap each other in the extension direction of the division line 22 and in the width direction of the division line 22. Also in this way, a substantially continuous modified area is formed. This alternative approach will be further detailed below with reference to FIG. 9(*b*).

While only one division line 22 is shown in FIG. 6(*a*), the remaining division lines 22 are provided with a single row of modified regions 23 in the same manner as shown in this figure.

In the process of dividing the optical device wafer 2, substrate material is removed along the division line 22 first, using a cutting means 6, such as a rotating blade or a saw, as is schematically shown in FIGS. 6(*a*) and (*b*). As is shown in these figures, a width, in the direction substantially perpendicular to the extension direction of the division line 22, of an area of the optical device wafer 2 in which the single row of modified regions 23 has been formed is substantially the same as a width, in the direction substantially perpendicular to the extension direction of the division line 22, of the cutting means 6.

The cutting means 6 is moved towards the front side 2*a* of the optical device wafer 2 and made to cut into the area of the wafer 2 in which the row of modified regions 23 has been formed, as is indicated by the arrows in FIGS. 6(*a*) and (*b*). As is shown in FIG. 6(*c*), in the cutting step, the substrate material is removed along only a part of the thickness, in the direction from the front side 2*a* towards the back side 2*b*, of the optical device wafer 2. For example, the substrate material may be removed along approximately 50% of the thickness of the optical device wafer 2 in the cutting step.

The cutting step is performed in the manner detailed above for all of the division lines 22 formed on the front side 2*a* of the optical device wafer 2. Subsequently, the back side 2*b* of the optical device wafer 2 is ground using a grinding apparatus (not shown), as is illustrated in FIG. 6(*c*).

The grinding apparatus may include a chuck table (not shown) for holding a workpiece and a grinding means (not shown) for grinding the workpiece held on the chuck table. The chuck table may have an upper surface as a holding surface for holding the workpiece thereon under suction. The grinding means may include a spindle housing (not shown), a rotating spindle (not shown) rotatably supported to the spindle housing and adapted to be rotated by a driving mechanism (not shown), a mounter (not shown) fixed to the lower end of the rotating spindle and a grinding tool 8 (see FIG. 6(*c*)) mounted on the lower surface of the mounter. The grinding tool 8 may comprise a circular base 81 and abrasive elements 82 mounted on the lower surface of the circular base 81.

Grinding of the back side 2*b* of the optical device wafer 2 is performed by holding the wafer 2 on the chuck table (not shown) of the grinding apparatus so that the front side 2*a* of the wafer 2 is in contact with the upper surface of the chuck table. Hence, the back side 2*b* of the wafer 2 is oriented upwards. Subsequently, the chuck table with the optical device wafer 2 held thereon is rotated around an axis perpendicular to the plane of the optical device wafer 2 and the grinding tool 8 is rotated around an axis perpendicular to the plane of the circular base 81. While rotating the chuck table and the grinding tool 8 in this manner, the abrasive elements 82 of the grinding tool 8 are brought into contact with the back side 2*b* of the wafer 2, thus grinding the back side 2*b*. Grinding is performed along a remaining part of the thickness of the optical device wafer 2, in which no substrate material has been removed in the cutting step, so as to divide the wafer 2 along the division lines 22.

Dividing the optical device wafer 2 in this manner allows for individual chips or dies (not shown) with a high die strength and high quality side surfaces to be obtained in a particularly accurate, reliable and efficient manner.

In the following, further preferred embodiments of the present invention will be described with reference to FIGS. 7 and 8.

These embodiments differ from the embodiments detailed above with reference to FIGS. 1 to 6 in the arrangement of the modified regions 23 and in the details of the step of removing substrate material along the division lines.

Figure 7:
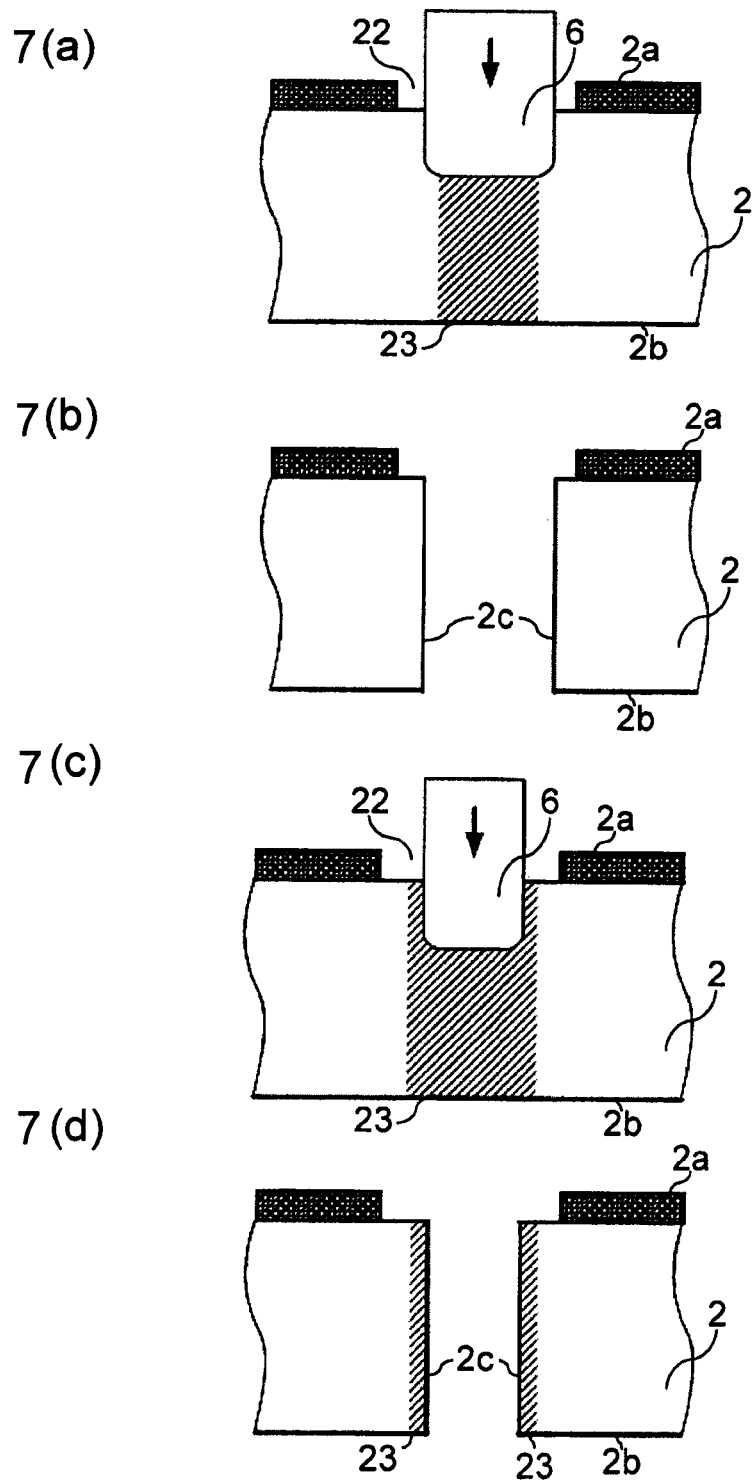
Figure 8:
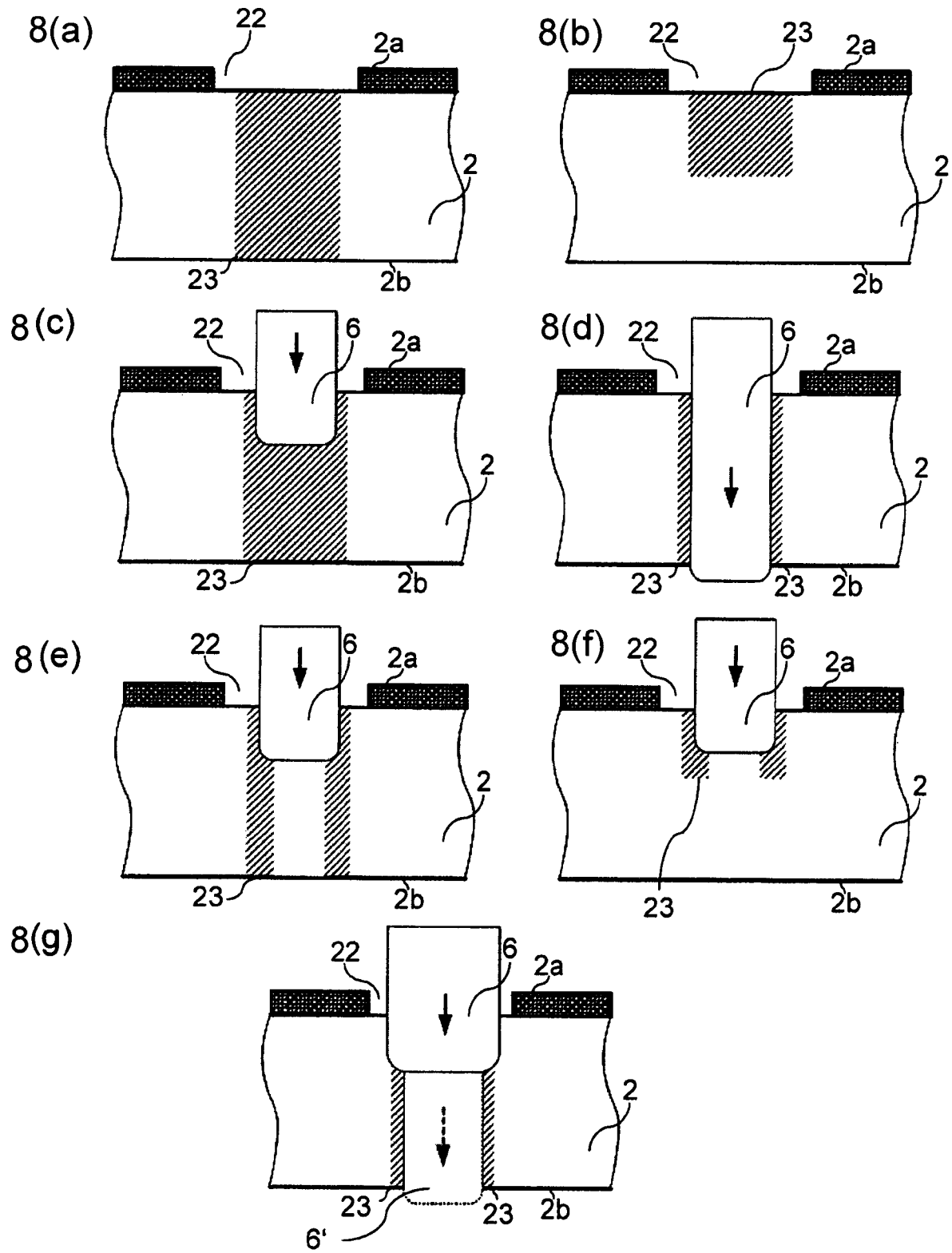
FIGS. 8(a) to 8(g) illustrate steps of removing substrate material along a division line for further different embodiments of the present invention.

The substrate material removing step, i.e., the cutting step, illustrated in FIGS. 7(*a*) and (*b*) differs from the substrate material removing step illustrated in FIGS. 6(*a*) and (*b*) mainly in that the width of the area of the optical device wafer 2 in which the row of modified regions 23 has been formed is smaller than the width of the cutting means 6, as is shown in FIG. 7(*a*). Further, as is shown in FIG. 7(*b*), the substrate material is removed along the entire thickness of the optical device wafer 2, i.e., the wafer 2 is cut by the cutting means 6 along its entire thickness.

Performing the substrate material removing step in this manner offers the benefit that the modified regions 23 can be prevented from remaining on the side surfaces 2*c* of the resulting chips or dies in a particularly reliable manner (see FIG. 7(*b*)). Hence, high quality chips or dies can be obtained in a simple way.

The substrate material removing step, i.e., the cutting step, illustrated in FIGS. 7(*c*) and (*d*) differs from the substrate material removing step illustrated in FIGS. 6(*a*) and (*b*) mainly in that the width of the area of the optical device wafer 2 in which the row of modified regions 23 has been formed is larger than the width of the cutting means 6, as is shown in FIG. 7(*c*). Further, the substrate material is removed along the entire thickness of the optical device wafer 2, i.e., the wafer 2 is cut along its entire thickness by the cutting means 6, as is shown in FIG. 7(*d*).

In this way, the substrate material removing step can be particularly efficiently carried out, since it can be reliably ensured that substantially the entire cutting area in which the cutting means 6 comes into contact with the optical device wafer 2 has been reduced in strength by the formation of the modified regions 23.

Modified regions 23 remaining on the side surfaces 2*c* of the resulting chips or dies (see FIG. 7(*d*)) can be removed in an additional grinding or polishing step, if desired.

As is schematically shown in FIGS. 6(*a*), 7(*a*) and (*c*) and 8(*a*) and (*c*), the modified regions 23 may be formed so as to extend along the entire thickness of the optical device wafer 2. As has been detailed above, this approach facilitates both the substrate material removing step and the grinding step.

Alternatively, as is schematically shown in FIGS. 8(b) and (f), the modified regions 23 may be formed so as to extend along only a part of the thickness of the optical device wafer 2. In this way, the formation of the modified regions 23 can be performed in a particularly efficient manner.

As is illustrated in FIGS. 6(b) and 8(c), the substrate material may be removed along only a part of the thickness of the optical device wafer 2, e.g., the optical device wafer 2 may be cut along only a part of its thickness. In this case, the optical device wafer 2 may be divided, for example, by grinding the back side 2b thereof in the manner described in detail above.

Alternatively, as is schematically shown in FIGS. 7(b) and (d) and in FIG. 8(d), the substrate material may be removed along the entire thickness of the optical device wafer 2, e.g., the wafer 2 may be cut along its entire thickness.

A distance between adjacent rows of modified regions 23 may be larger for rows of modified regions 23 arranged closer to the centre of the division line 22 than for rows of modified regions 23 arranged further away from the centre of the division line 22, as has been detailed above. In this case, fewer rows of modified regions 23 have to be formed, thus enhancing the efficiency of the modified region forming step. Further, the smaller distance between adjacent rows of modified regions 23 away from the centre of the division line 22 ensures that damage to the side surfaces of the resulting chips or dies in the cutting process, such as chipping or cracking, can be prevented.

A similar approach is illustrated in FIGS. 8(e) and (f). In the embodiment shown in these figures, two rows of modified regions 23 are formed within the width of the division line 22 so that adjacent or neighbouring modified regions at least partially overlap each other in the extension direction of the division line 22 but do not overlap each other in the width direction of the division line 22. Thus, a gap between the two rows of modified regions 23 is present in the width direction of the division line 22.

The modified regions 23 may be formed so as to extend along the entire thickness of the optical device wafer 2 (see FIG. 8(e)) or so as to extend along only a part of the thickness of the optical device wafer 2 (see FIG. 8(f)).

The step of removing substrate material along the division line 22 may be performed with different material removal widths. For example, in a first material removing step, substrate material may be removed with a first width and, in a second material removing step, substrate material may be removed with a second width. The second removal width may be smaller than the first removal width.

In particular, as is shown in FIG. 8(g), in the substrate material removing step, the optical device wafer 2 may be first cut with a first cutting means 6 along a part of its thickness. The width of the first cutting means 6 may be substantially the same as the width of the area of the optical device wafer 2 in which the row of modified regions 23 has been formed. Subsequently, a remaining part of the area in which the row of modified regions 23 has been formed may be cut using a second cutting means 6' (shown by a dotted line in FIG. 8(g)) with a width that is smaller than that of the first cutting means 6.

A row or rows of modified regions 23 arranged closer to the centre of the division line 22, in the width direction of the division line 22, may be formed with a pulsed laser beam LB having a higher power than a pulsed laser beam LB used for forming a row or rows of modified regions 23 arranged further away from the centre of the division line 22, in the width direction of the division line 22.

FIGS. 9(a) to 9(c) are schematic perspective views showing examples of arrangements of a single row or two rows of modified regions 23 within the division line 22 for different embodiments of the method of the present invention. In particular, FIGS. 9(a) to 9(c) show schematic views of division lines 22 with modified regions 23 arranged therein.

In the embodiment shown in FIG. 9(a), a single row of modified regions 23 is formed within the width of the division line 22.

The modified regions 23 are formed so that adjacent or neighbouring modified regions 23 at least partially overlap each other in the extension direction of the division line 22, as is schematically shown in FIG. 9(a). In this way, a substantially continuous modified area (i.e., the hatched area in FIG. 9(a)) is formed along part of the width of the division line 22.

Since only a single row of modified regions 23 is formed within each division line 22, substrate processing can be carried out in a particularly efficient manner at an increased processing speed.

In the embodiment shown in FIG. 9(b), two rows of modified regions 23 are formed within the width of the division line 22.

The modified regions 23 are formed so that adjacent or neighbouring modified regions 23 at least partially overlap each other in the extension direction of the division line 22 and in the width direction of the division line 22, as is schematically shown in FIG. 9(b). In this way, a substantially continuous modified area (i.e., the hatched area in FIG. 9(b)) is formed along part of the width of the division line 22.

In the embodiment shown in FIG. 9(c), two rows of modified regions 23 are formed within the width of the division line 22, and the modified regions 23 are formed so that adjacent or neighbouring modified regions 23 do not overlap each other in the extension direction of the division line 22 and in the width direction of the division line 22. In this way, it can be particularly reliably ensured that the substrate 2 maintains a sufficient degree of strength or robustness for allowing efficient further handling and/or processing thereof, in particular, in the step of removing substrate material along the division line 22.

All of the modified regions 23 in the embodiments shown in FIGS. 9(a) to (c) have a substantially cylindrical shape or a slightly tapered shape. These modified regions 23 have been formed with a pulsed laser beam LB having a circular focused spot shape. However, in other embodiments, the pulsed laser beam LB may have, for example, an oval focused spot shape, a square focused spot shape or a different type of focused spot shape.

Figure 10:
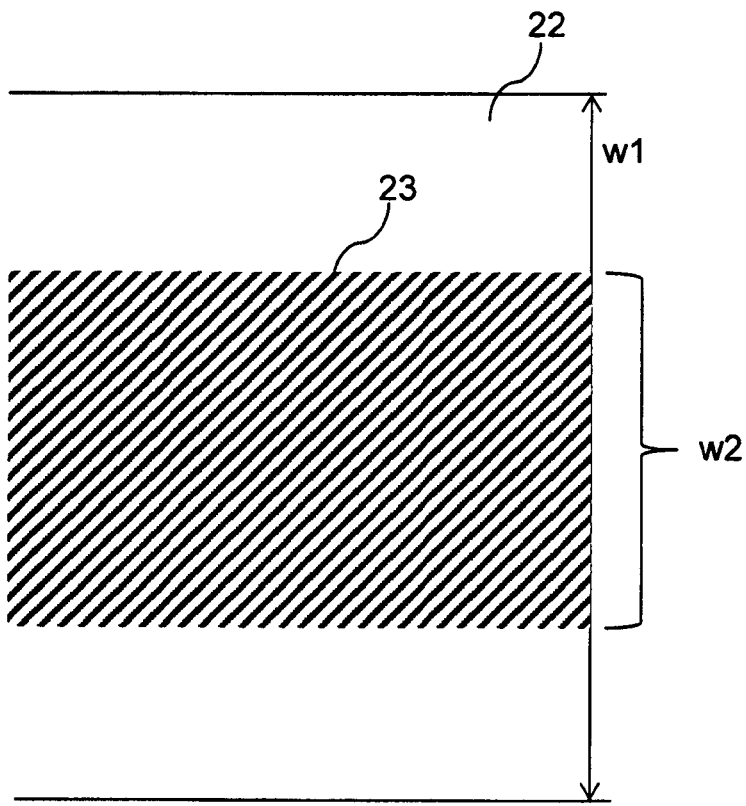
FIGS. 10(a) and 10(b) show examples of arrangements of modified regions within a division line for different embodiments of the method of the present invention.
Figure 10:
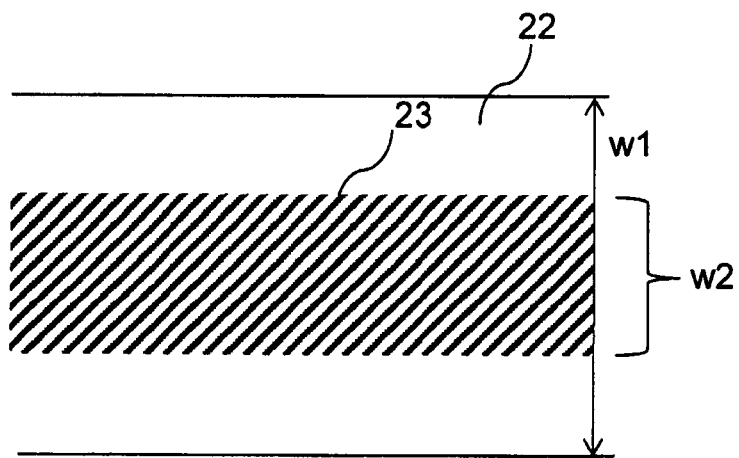

FIGS. 10(a) and 10(b) show examples of arrangements of modified regions 23 for different embodiments of the method of the present invention. As is shown in these drawings, the modified regions 23 at least partially overlap each other.

FIG. 10(a) shows an example in which a single row of modified regions 23 or plural rows of modified regions 23 which overlap each other in the width direction of the division line 22 are formed within the division line 22, thus forming a substantially continuous modified area (i.e., the hatched area in FIG. 10(a)). The division line 22 has a width w1 of approximately 100 μm. A width w2, in the direction substantially perpendicular to the extension direction of the division line 22, of the area of the substrate 2, in which the row or rows of modified regions 23 have been formed, is approximately 48 µm.

Substrate material may be removed along the division line 22 where the modified regions 23 are formed, e.g., by using a cutting means (not shown), such as a blade or a saw. Particularly preferably, the cutting means may have a width, in the direction substantially perpendicular to the extension direction of the division line 22, which is slightly larger than the width w2 of the area of the substrate 2, in which the row or rows of modified regions 23 have been formed. For example, the cutting means may have a width of approximately 50 µm.

The arrangement of the row or rows of modified regions 23 shown in FIG. 10(b) differs from that shown in FIG. 10(a) only in the width w1 of the division line 22 and the width w2, in the direction substantially perpendicular to the extension direction of the division line 22, of the area of the substrate 2, in which the row or rows of modified regions 23 have been formed.

The division line 22 shown in FIG. 10(b) has a width w1 of approximately 50 µm. The width w2 of the area of the substrate 2, in which the row or rows of modified regions 23 have been formed, is approximately 22 µm.

Substrate material may be removed along the division line 22 shown in FIG. 10(b) where the modified regions 23 are formed, e.g., by using a cutting means (not shown), such as a blade or a saw. Particularly preferably, the cutting means may have a width, in the direction substantially perpendicular to the extension direction of the division line 22, which is slightly larger than the width w2 of the area of the substrate 2, in which the row or rows of modified regions 23 have been formed. For example, the cutting means may have a width of approximately 25 µm.

The invention claimed is:

1. A method of processing a substrate, having a first surface with at least one division line formed thereon and a second surface opposite the first surface, the method comprising:
    applying a pulsed laser beam to the substrate from the side of the first surface, the pulsed laser beam having a wavelength such that it is absorbed by the substrate, the pulsed laser beam being applied at least in a plurality of positions along the at least one division line, so as to form a plurality of modified regions in the substrate, each modified region extending at least from the first surface towards the second surface, such that each modified region is present in the first surface, wherein each modified region is formed by melting substrate material by means of the pulsed laser beam and allowing the molten substrate material to resolidify; and
    removing substrate material along the at least one division line where the plurality of modified regions has been formed.

2. The method according to claim 1, wherein each modified region is formed by melting substrate material by means of the pulsed laser beam and allowing the molten substrate material to resolidify, without forming any openings open to the first surface or the second surface.

3. The method according to claim 1, wherein the pulsed laser beam is applied to the substrate in a condition where a focal point of the pulsed laser beam is located on the first surface or at a distance from the first surface in the direction opposite to the direction from the first surface towards the second surface.

4. The method according to claim 1, wherein the pulsed laser beam is applied to the substrate in a condition where a focal point of the pulsed laser beam is located on the first surface r at a distance from the first surface in the direction from the first surface towards the second surface.

5. The method according to claim 1, wherein the substrate is a single crystal substrate or a compound substrate or a polycrystalline substrate.

6. The method according to claim 1, wherein the modified regions comprise amorphous regions, or the modified regions are amorphous regions.

7. The method according to claim 1, wherein the substrate material is removed by cutting the substrate along the at least one division line where the plurality of modified regions has been formed.

8. The method according to claim 1, wherein the substrate material is mechanically removed along the at least one division line where the plurality of modified regions has been formed, in particular, by mechanically cutting the substrate along the at least one division line where the plurality of modified regions has been formed.

9. The method according to claim 1, further comprising grinding the second surface of the substrate to adjust the substrate thickness.

10. The method according to claim 9, wherein grinding the second surface of the substrate is performed after removing the substrate material along the at least one division line where the plurality of modified regions has been formed.

11. The method according to claim 10, wherein
    the substrate material is removed along only a part of the thickness, in the direction from the first surface towards the second surface, of the substrate, and
    grinding the second surface of the substrate is performed along a remaining part of the thickness of the substrate, in which no substrate material has been removed, so as to divide the substrate along the at least one division line.

12. The method according to claim 1, wherein the modified regions are formed so as to extend along only a part of the thickness, in the direction from the first surface towards the second surface, of the substrate, or so as to extend along the entire thickness, in the direction from the first surface towards the second surface, of the substrate.

13. The method according to claim 1, wherein the substrate material is removed along the entire extension, in the direction from the first surface towards the second surface, of the modified regions.

14. The method according to claim 1, wherein
    the at least one division line has a width in a direction substantially perpendicular to the extension direction of the at least one division line, and
    the method further comprises applying the pulsed laser beam also in a plurality of positions along the width direction of the at least one division line, so as to form within the width of the division line a plurality of rows of modified regions, each row extending along the extension direction of the at least one division line, wherein the rows are arranged adjacent to each other in the width direction of the at least one division line.

15. The method according to claim 1, wherein
    the at least one division line has a width in a direction substantially perpendicular to the extension direction of the at least one division line, and
    a single row of modified regions is formed within the width of the at least one division line, the row extending along the extension direction of the at least one division line.

16. The method according to claim 15, wherein
the substrate material is removed along the at least one division line where the plurality of modified regions has been formed by mechanically cutting the substrate, using a cutting means, and
a width, in the direction substantially perpendicular to the extension direction of the at least one division line, of an area of the substrate, in which the row or rows of modified regions has or have been formed, is in a range of approximately 90% to 110% of a width, in the direction substantially perpendicular to the extension direction of the at least one division line, of the cutting means.

17. The method according to claim 16, wherein a row or rows of modified regions arranged closer to the centre of the at least one division line, in the width direction of the at least one division line, is or are formed with a pulsed laser beam having a higher power than a pulsed laser beam used for forming a row or rows of modified regions arranged further away from the centre of the at least one division line, in the width direction of the at least one division line.

* * * * *